(12) United States Patent
Lyon et al.

(10) Patent No.: US 11,469,573 B2
(45) Date of Patent: Oct. 11, 2022

(54) VERTICAL EMITTERS WITH INTEGRAL MICROLENSES

(71) Applicant: Apple Inc., Cupertino, CA (US)

(72) Inventors: Keith Lyon, San Jose, CA (US); Arnaud Laflaquiere, Singapore (SG)

(73) Assignee: APPLE INC., Cupertino, CA (US)

( * ) Notice: Subject to any disclaimer, the term of this patent is extended or adjusted under 35 U.S.C. 154(b) by 375 days.

(21) Appl. No.: 16/779,609

(22) Filed: Feb. 2, 2020

(65) Prior Publication Data
US 2020/0251882 A1    Aug. 6, 2020

Related U.S. Application Data

(60) Provisional application No. 62/869,577, filed on Jul. 2, 2019, provisional application No. 62/800,577, filed on Feb. 4, 2019.

(51) Int. Cl.
*H01S 5/00*    (2006.01)
*H01S 5/183*    (2006.01)
(Continued)

(52) U.S. Cl.
CPC .......... *H01S 5/18388* (2013.01); *H01S 5/021* (2013.01); *H01S 5/026* (2013.01);
(Continued)

(58) Field of Classification Search
CPC ...... H01S 5/18388; H01S 5/423; H01S 5/021; H01S 5/18305; H01S 5/3013;
(Continued)

(56) References Cited

U.S. PATENT DOCUMENTS 6,751,379 B2   6/2004  Capewell et al.
7,257,141 B2   8/2007  Chua
(Continued)

FOREIGN PATENT DOCUMENTS

CN    102709808 A    10/2012
CN    103412406 A    11/2013
(Continued)

OTHER PUBLICATIONS

CN Application # 201710327709.6 office action dated Apr. 29, 2020.
(Continued)

*Primary Examiner* — Kinam Park
(74) *Attorney, Agent, or Firm* — Kligler & Associates Patent Attorneys Ltd (57) ABSTRACT

An optoelectronic device includes a semiconductor substrate having first and second faces. A first array of emitters are formed on the first face of the semiconductor substrate and are configured to emit respective beams of radiation through the substrate. Electrical connections are coupled to actuate selectively first and second sets of the emitters in the first array. A second array of microlenses are formed on the second face of the semiconductor substrate in respective alignment with the emitters in at least one of the first and second sets and are configured to focus the beams emitted from the emitters in the at least one of the first and second sets so that the beams are transmitted from the second face with different, respective first and second focal properties.

20 Claims, 5 Drawing Sheets

(51) Int. Cl.
*H01S 5/02* (2006.01)
*H01S 5/30* (2006.01)
*H01S 5/42* (2006.01)
*H01S 5/02255* (2021.01)
*H01S 5/026* (2006.01)
*G02B 27/42* (2006.01)
*H01S 5/02253* (2021.01)
*H01S 5/02326* (2021.01)

(52) U.S. Cl.
CPC ........ *H01S 5/0207* (2013.01); *H01S 5/02255* (2021.01); *H01S 5/18305* (2013.01); *H01S 5/18391* (2013.01); *H01S 5/3013* (2013.01); *H01S 5/423* (2013.01); *G02B 27/4233* (2013.01); *H01S 5/02253* (2021.01); *H01S 5/02326* (2021.01)

(58) Field of Classification Search
CPC .... H01S 5/02255; H01S 5/0207; H01S 5/026; H01S 5/18391
See application file for complete search history.

(56) References Cited

U.S. PATENT DOCUMENTS

| | | | |
|---|---|---|---|
| 7,825,423 B2 | 11/2010 | Shiraishi et al. | |
| 8,526,476 B2 | 9/2013 | Engl et al. | |
| 8,783,893 B1 | 7/2014 | Seurin | |
| 9,048,633 B2 | 6/2015 | Gronenborn et al. | |
| 9,112,330 B2 | 8/2015 | Gronenborn et al. | |
| 9,553,423 B2 | 1/2017 | Chen et al. | |
| 9,746,369 B2* | 8/2017 | Shpunt | G06F 3/011 |
| 10,072,815 B2 | 9/2018 | MacKinnon et al. | |
| 10,295,145 B2 | 5/2019 | MacKinnon et al. | |
| 11,025,898 B2 | 6/2021 | Avraham et al. | |
| 2002/0048292 A1 | 4/2002 | Bissinger et al. | |
| 2003/0026310 A1 | 2/2003 | Valliath | |
| 2004/0070855 A1 | 4/2004 | Benitez et al. | |
| 2004/0130790 A1 | 7/2004 | Sales | |
| 2004/0184155 A1* | 9/2004 | Kornblit | G02B 26/0875 359/619 |
| 2006/0045144 A1 | 3/2006 | Karlsen et al. | |
| 2006/0066192 A1 | 3/2006 | Beeson et al. | |
| 2007/0071056 A1* | 3/2007 | Chen | G01S 17/42 372/50.124 |
| 2008/0054281 A1 | 3/2008 | Narendran et al. | |
| 2008/0267232 A1 | 10/2008 | DeNatale | |
| 2009/0032511 A1* | 2/2009 | Adams | B23K 26/067 219/121.75 |
| 2009/0161033 A1 | 6/2009 | Kaise | |
| 2010/0019136 A1 | 1/2010 | Merenda et al. | |
| 2010/0208763 A1 | 8/2010 | Engl et al. | |
| 2011/0019048 A1* | 1/2011 | Raynor | H04N 5/332 257/E31.095 |
| 2012/0147912 A1 | 6/2012 | Moench et al. | |
| 2013/0223466 A1* | 8/2013 | Gronenborn | G02B 19/0057 372/50.23 |
| 2013/0329429 A1 | 12/2013 | Lowes et al. | |
| 2013/0334559 A1 | 12/2013 | Vdovin et al. | |
| 2015/0092802 A1* | 4/2015 | Gronenborn | G02B 17/06 372/75 |
| 2015/0340841 A1 | 11/2015 | Joseph | |
| 2016/0164261 A1* | 6/2016 | Warren | H04N 5/332 372/50.122 |
| 2016/0254638 A1* | 9/2016 | Chen | H04N 13/254 362/11 |
| 2017/0033535 A1 | 2/2017 | Joseph | |
| 2018/0041755 A1 | 2/2018 | Fettig et al. | |
| 2019/0363520 A1* | 11/2019 | Laflaquiere | H01L 25/167 |
| 2020/0057145 A1* | 2/2020 | Townsend | G01S 7/4817 |
| 2020/0081165 A1 | 3/2020 | Avraham et al. | |
| 2020/0194973 A1* | 6/2020 | Bloemen | H01S 5/18388 |
| 2020/0194975 A1* | 6/2020 | Gronenborn | H01S 5/02253 |
| 2020/0209729 A1* | 7/2020 | Chen | G06F 3/044 |
| 2020/0350744 A1* | 11/2020 | Gerlach | H01S 5/18361 |
| 2021/0013703 A1* | 1/2021 | Numata | H01S 3/1643 |
| 2021/0351561 A1 | 11/2021 | Lyon | |

FOREIGN PATENT DOCUMENTS

| | | |
|---|---|---|
| DE | 102007029370 A1 | 11/2008 |
| EP | 0488772 A1 | 6/1992 |
| JP | 09061610 A1 | 3/1997 |
| JP | 2012181243 A | 9/2012 |
| WO | 2010067261 A1 | 6/2010 |
| WO | 2016131658 A1 | 8/2016 |
| WO | 2018053378 A1 | 3/2018 |
| WO | 2019181757 A1 | 9/2019 |

OTHER PUBLICATIONS

KR Application # 10-2018-7028292 office action dated May 20, 2020.
Zhan et al., "Confined Etchant Layer Technique (CELT) for Micromanufacture," Proceedings of the 6th IEEE International Conference on Nano/Micro Engineered and Molecular Systems, pp. 863-867, Feb. 20-23, 2011.
Gimkiewicz et al., "Fabrication of microprisms for planar optical interconnections by use of analog gray scale lithography with high-energy-beam-sensitive glass", Applied Optics, vol. 38, No. 14, pp. 2986-2990, May 10, 1999.
International Application # PCT/US2021/027853 Search Report dated Jul. 13, 2021.
International Application # PCT/US2020/015763 Search Report dated Aug. 19, 2020.
KR Application # 10-2020-7017879 Office Action dated Aug. 18, 2022.

* cited by examiner

VERTICAL EMITTERS WITH INTEGRAL MICROLENSES

CROSS-REFERENCE TO RELATED APPLICATION

This application claims the benefit of U.S. Provisional Patent Application 62/800,577, filed Feb. 4, 2019, and of U.S. Provisional Patent Application 62/869,577, filed Jul. 2, 2019. Bother of these related applications are incorporated herein by reference.

FIELD OF THE INVENTION

The present invention relates generally to optoelectronic devices, and particularly to projectors of patterned illumination using arrays of solid-state emitters, such as vertical-cavity surface-emitting lasers (VCSELs).

BACKGROUND

Integrated VCSEL arrays can be used to generate either flood illumination, in which a target area is uniformly illuminated, or structured illumination, in which a pattern, such as an array of spots, is projected onto a target area. Depending on the optical configuration, the light emitted from each VCSEL can be projected into a single spot, or alternatively, a diffractive optical element (DOE) can be used to split the light from each VCSEL into multiple spots.

In most VCSEL arrays, the drive circuits are constructed so that all of the VCSELs on a given chip are excited and emit light simultaneously. Recently-developed technologies, however, make it possible to drive the VCSELs selectively, for example by mounting a III-V chip with an array of VCSELs on a silicon substrate on which control circuits are formed, as described in PCT International Publication WO 2018/053378, whose disclosure is incorporated herein by reference.

Because of their very short resonator length and complex radial mode structure, VCSELs tend to have high native divergence. To mitigate this problem, some VCSELs and VCSEL arrays include integrated microlenses, which are respectively aligned with the VCSELs. For example, U.S. Pat. No. 9,746,369, whose disclosure is incorporated herein by reference, describes a beam generating device that includes a semiconductor substrate, such as a GaAs wafer, having an optical passband. A first array of VCSELs is formed on a first face of the semiconductor substrate and are configured to emit respective laser beams through the substrate at a wavelength within the passband. A second array of microlenses is formed on a second face of the semiconductor substrate, with the microlenses in respective alignment with the VCSELs so as to transmit the laser beams generated by the VCSELs. This sort of device is shown specifically in FIGS. 11-12 of the above-mentioned patent and described in the specification starting at col. 14, line 19.

SUMMARY

Embodiments of the present invention that are described hereinbelow provide improved devices for generating and projecting optical radiation, as well as methods for manufacture of such devices.

There is therefore provided, in accordance with an embodiment of the invention, an optoelectronic device, including a semiconductor substrate having first and second faces. A first array of emitters are formed on the first face of the semiconductor substrate and are configured to emit respective beams of radiation through the substrate. Electrical connections are coupled to actuate selectively first and second sets of the emitters in the first array. A second array of microlenses are formed on the second face of the semiconductor substrate in respective alignment with the emitters in at least one of the first and second sets and are configured to focus the beams emitted from the emitters in the at least one of the first and second sets so that the beams are transmitted from the second face with different, respective first and second focal properties.

In a disclosed embodiment, the semiconductor substrate includes a III-V semiconductor substrate, and the device includes a silicon substrate on which the electrical connections are formed, the electrical connections including bonding pads to which the emitters in the first array are respectively connected. Additionally or alternatively, the emitters include vertical-cavity surface-emitting lasers (VCSELs).

In some embodiments, the device includes projection optics, which are configured to focus the beams from the emitters in the first set to form a pattern of structured light in an area of a far field while spreading the beams from the emitters in the second set so as to project flood illumination over the area. In a disclosed embodiment, the emitters in the first set are disposed across the semiconductor substrate in a predefined spatial distribution, and the pattern of structured light includes a pattern of spots reproducing the spatial distribution of the emitters in the first set. In one embodiment, the microlenses are formed only in alignment with the emitters in the second set.

Additionally or alternatively, the microlenses that are formed in alignment with the emitters in the second set are displaced transversely on the second surface relative to respective ones of the emitters in the second set so as to focus the beams emitted from the emitters in the second set toward a peripheral region of a focal plane of the device, and the projection optics includes a diffuser disposed in the peripheral region of the focal plane and configured to spread the beams that pass through the peripheral region, while the beams that pass through a central region of the focal plane are not diffused. In one embodiment, the projection optics include a diffractive optical element (DOE), which is disposed in a central region of the focal plane and is configured to create multiple replicas of the pattern of structured light in the far field.

In a disclosed embodiment, the microlenses in the second array include doublet lenses.

There is additionally provided, in accordance with an embodiment of the invention, an optical device, including a semiconductor substrate having a first face and a second face, which is etched to define a first array of first microlenses configured to focus optical radiation that has been transmitted through the substrate. A second array of second microlenses is disposed on the substrate over the first array in alignment with the first microlenses.

In a disclosed embodiment, the semiconductor substrate includes a III-V semiconductor substrate.

In some embodiments, the device includes a third array of emitters, which are formed on the first face of the semiconductor substrate in alignment with the first microlenses and are configured to emit respective beams of the optical radiation through the substrate. In a disclosed embodiment, the emitters include vertical-cavity surface-emitting lasers (VCSELs), and the first and second microlenses are configured to focus multiple modes of each of the VCSELs to a respective beam waist outside the semiconductor substrate.

In the disclosed embodiments, the second microlenses include a polymer and/or a glass.

In one embodiment, the second microlenses are offset in a transverse direction along the second face relative to the first microlenses with which they are respectively aligned.

There is additionally provided, in accordance with an embodiment of the invention, a method for manufacturing an optical device. The method includes etching a semiconductor substrate, having a first face and a second face, to define, on the second face, a first array of first microlenses configured to focus optical radiation that has been transmitted through the substrate. A second array of second microlenses is deposited over the first array in alignment with the first microlenses.

In a disclosed embodiment, depositing the second microlenses includes molding a polymer over the second face to define the second microlenses. Alternatively or additionally, depositing the second microlenses includes applying a photolithographic process to a polymer layer extending over the second face to define the second microlenses.

In one embodiment, depositing the second microlenses includes detecting a misalignment between the first microlenses and emitters of the optical radiation disposed on the first face of the semiconductor substrate, and offsetting the second microlenses in a transverse direction along the second face relative to the first microlenses so as to compensate for the detected misalignment.

The present invention will be more fully understood from the following detailed description of the embodiments thereof, taken together with the drawings in which:

DETAILED DESCRIPTION OF EMBODIMENTS

Overview

Projecting a structured-light pattern of high quality and low distortion over a wide field requires careful design of the optics used for projection. When conventional lenses are used for this purpose, the resulting design is often bulky and costly.

Some embodiments of the present invention that are described herein overcome these constraints by forming integrated microlenses over an array of VCSELs. Specifically, in an example embodiment, an array of VCSELs is fabricated on a GaAs substrate, after which the back side of the substrate is thinned, and microlenses are formed on the back side of the substrate in alignment with the locations of the VCSELs. The microlenses may be formed by etching of the GaAs substrate and/or deposition and processing (by molding or etching, for example) of additional layers, such as polymer layers.

In some embodiments, the microlenses are not centered over each VCSEL in the array, but rather, some or all of the microlenses are intentionally decentered for improved optical performance. For example, the microlenses of the VCSELs can be displaced inwardly, with greatest displacement at the edges of the array. Alternatively or additionally, the microlenses may be decentered for the purpose of beam steering.

In other embodiments, microlenses formed on the back side of a VCSEL array chip may have multiple refractive surfaces to achieve improved optical performance, particularly for handling of multiple laser modes, and particularly the more divergent, higher-order transverse modes. For example, "doublet" microlenses may be produced by fabricating a polymer lens over an etched GaAs lens.

In some embodiments, multiple different types of microlenses are formed over different VCSELs in an array in order to achieve different illumination properties; or alternatively, microlenses may be formed over some of the VCSELs but not others. For example, different sets of VCSELs in a single integrated array can be used to generate structured light (a pattern of spots) and flood illumination, respectively. In this example, microlenses are formed over one set of the VCSELs but not the other; but alternatively, both sets of VCSELs may have microlenses of different, respective curvatures. A switching circuit, implemented in silicon, for example, can be used to select the set of VCSELs to be actuated at any given time, depending on the type of illumination that is required.

Emitter Arrays with Integral Microlenses

Figure 1A:
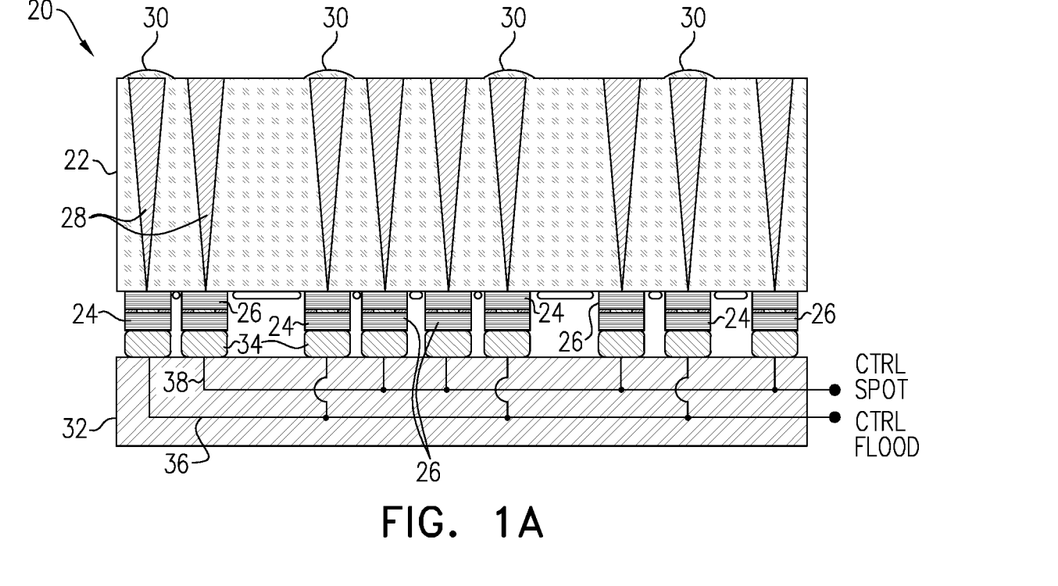
FIGS. 1A and 1B are schematic sectional and frontal views of an integrated emitter device, in accordance with an embodiment of the invention.
Figure 1B:
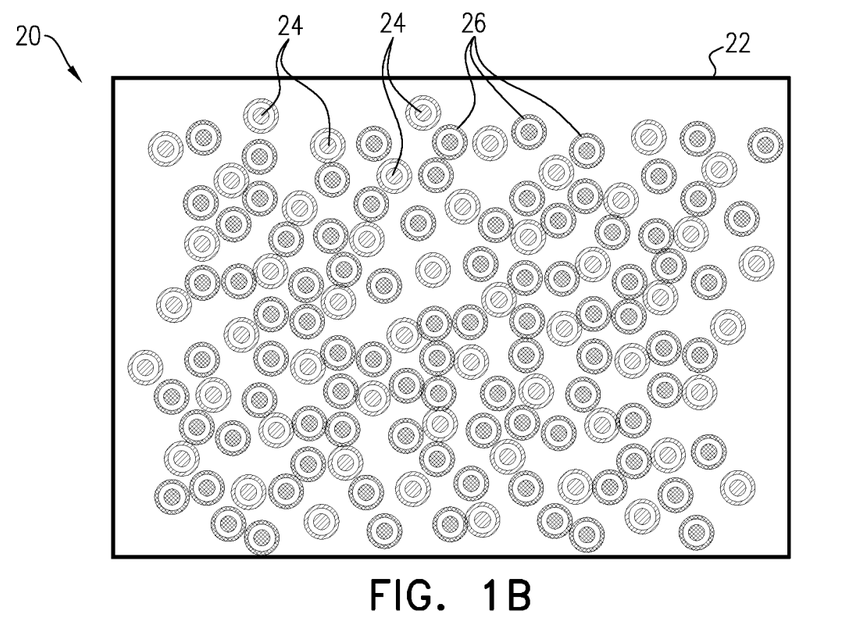

FIGS. 1A and 1B are schematic sectional and frontal views of an integrated emitter device 20, in accordance with an embodiment of the invention. The drawings are not to scale.

Device 20 comprises a semiconductor substrate 22, for example a substrate made from a wafer of GaAs or another III-V semiconductor. An array of emitters, such as VCSELs 24 and 26, is formed on one face of semiconductor substrate 22 in a back-emitting configuration, meaning that beams 28 of radiation emitted by the VCSELs are transmitted through substrate 22. For example, the VCSELs may emit the beams of radiation at a wavelength of 940 nm, at which GaAs is transparent. Alternatively, other sorts of substrates, as well as other sorts of emitters, such light-emitting diodes, which may emit radiation at other wavelengths, may be formed in this configuration.

In the pictured example, the VCSELs are divided into two sets, as explained further hereinbelow:

VCSELs 24 are to be used in projecting flood radiation onto an area of the far field (i.e., at distances from device 20 large enough so that propagation of the optical waves from the emitters is substantially uniform); and VCSELs 26 are to be used in forming a pattern of structured light on the area of the far field.

In this example, VCSELs 26 are disposed across semiconductor substrate 22 in a certain spatial distribution—in this case, an irregular distribution—and the structured light will comprise a pattern of spots that reproduces the spatial distribution of VCSELs 26.

Microlenses 30 are formed on the opposite face of semiconductor substrate 22, in respective alignment with VCSELs 24, in order to focus beams 28 emitted from these VCSELs, but no microlenses are formed over VCSELs 26. Consequently, the beams originating from VCSELs 24 will be transmitted out of the rear face of substrate 22 with different focal properties from those of VCSELs 26. Alternatively, the microlenses may be formed only in alignment with VCSELs 26, rather than VCSELs 24. Further alternatively, microlenses having different focal properties may be formed over both sets of the VCSELs. Microlenses 30 are typically formed by a suitable etching process, which is applied to the rear face (i.e., the upper face in the view shown in FIG. 1A) of semiconductor substrate 22.

A silicon wafer 32 is bonded to the front side of VCSELs 24, 26 in order to make the electrical connections needed in order to actuate the two sets of VCSELs selectively. The electrical connections include circuit lines 36 and 38, which connect to VCSELs 24 and 26, respectively, via suitable bonding pads 34, comprising solder bumps or other suitable conducting elements, for example. Application of a drive signal to line 36 will actuate VCSELs 24, so that device 20 will emit flood illumination; whereas application of a drive signal to line 38 will actuate VCSELs 26, resulting in emission of patterned light. Alternatively, the electrical connections may be made on the III-V semiconductor wafer on which VCSELs 24 and 26 are fabricated (particularly if the two sets of VCSELs are each grouped in a different, respective area or areas of the wafer).

Figure 2A:
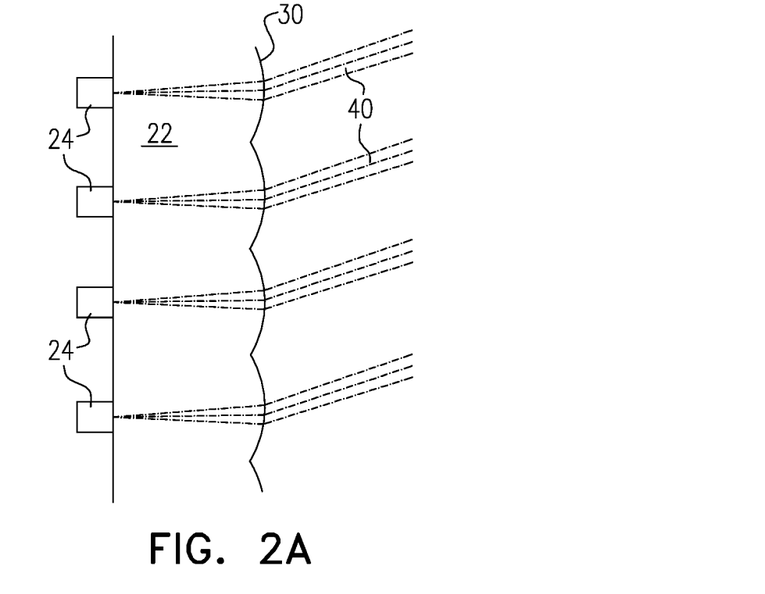
FIGS. 2A and 2B are schematic, sectional detail views showing beams emitted by two different types of emitters in an integrated emitter array, in accordance with an embodiment of the invention.
Figure 2B:
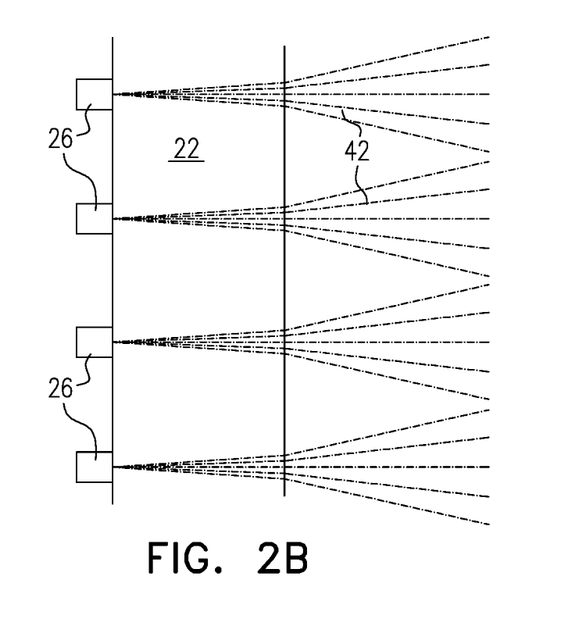

FIGS. 2A and 2B are schematic, sectional detail views showing beams 40 and 42 emitted by VCSELs 24 and 26, respectively, in accordance with an embodiment of the invention. Microlenses 30 in this example are formed in alignment only with VCSELs 24. Beams 40 are thus collimated as they exit substrate 22, whereas beams 42 diverge. More specifically, in the pictured example, microlenses 30 are displaced transversely on the back surface of substrate 22 relative to the respective VCSELs 24, with the result that beams 40 are directed in an oblique direction, rather than normal to the substrate. In the pictured example, beams 40 are all directed in the same direction; but alternatively, microlenses 30 may be displaced by different increments relative to VCSELs 24, in which case the beams will be directed at different angles.

Figure 3:
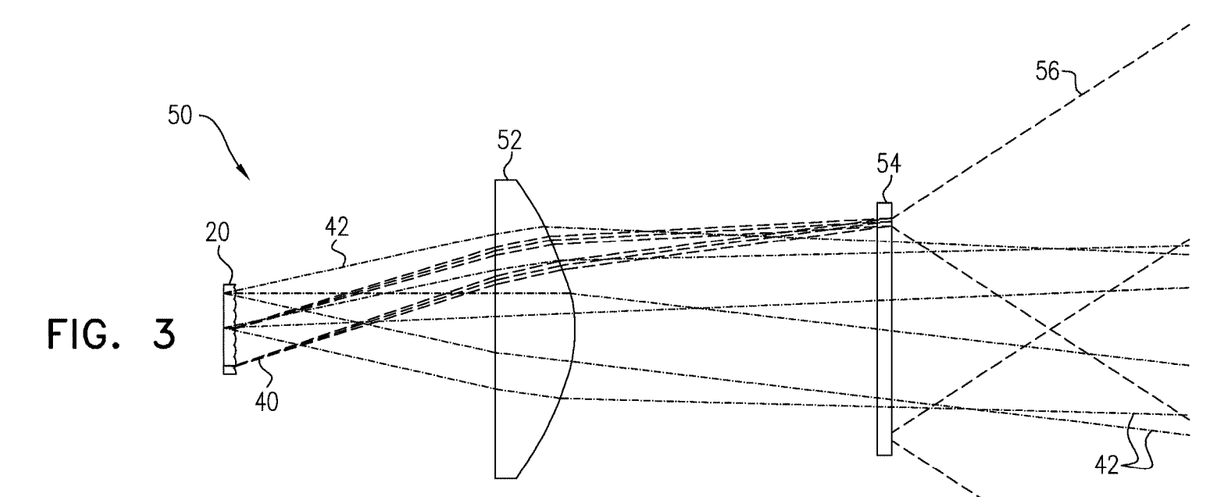
FIG. 3 is a schematic sectional view of an optical projection system, in accordance with an embodiment of the invention.

FIG. 3 is a schematic sectional view of an optical projection system 50, which is based on device 20, in accordance with an embodiment of the invention. Microlenses 30 are formed over substrate with the sort of transverse displacement that is shown in FIGS. 2A/B, so that beams 40 and 42 are output as described above. Projection optics 52, typically comprising a suitable lens or group of lenses, focus beams 42 to form a pattern of structured light in an area of the far field. As noted earlier, the structured light in this example may comprise a pattern of spots reproducing the spatial distribution of VCSELs 26 on substrate 22. At the same time, beams 40 are focused toward the peripheral region of a beam-conditioning component 54 in the focal plane of optics 52. Element 54 spreads beams 40 so as to project flood illumination 56 over the far-field area of interest. As noted earlier, system 50 is capable of selectively generating either patterned or flood illumination, or both simultaneously if desired.

Figure 4:
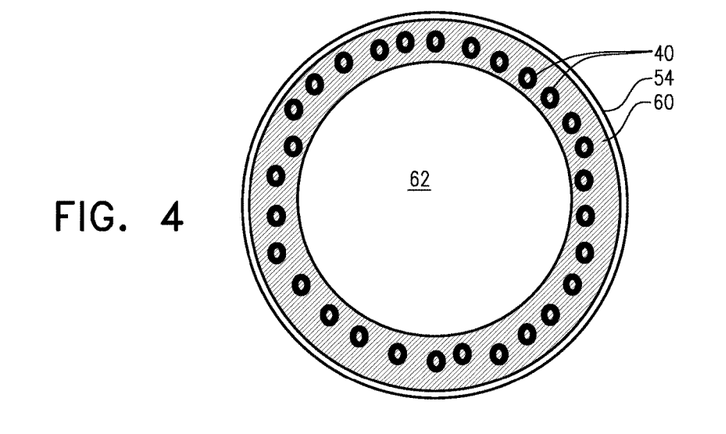
FIG. 4 is a schematic frontal view of a beam-conditioning component in the system of FIG. 3, in accordance with an embodiment of the invention.

FIG. 4 is a schematic frontal view of beam-conditioning component 54, in accordance with an embodiment of the invention. The peripheral part of component 54 comprises a diffuser 60, which spreads beams 40 over the appropriate angular range to create flood illumination 56, which uniformly (or nearly uniformly) illuminates a chosen angular field of view. Diffuser 60 may be refractive or diffractive, for example.

Projection optics 52 focus beams 42 through a central region 62 of component 54. In one embodiment, this central region comprises a diffractive optical element (DOE), which creates multiple replicas of the pattern of structured light in the far field. Thus, for example, the number of spots in the projected pattern may be a multiple of the number of VCSELs 26 in device 20. In this case, diffuser 60 may also be diffractive, but with different diffractive properties from the central DOE, despite occupying the same physical substrate.

Emitter Arrays with Doublet Microlenses

Figure 5:
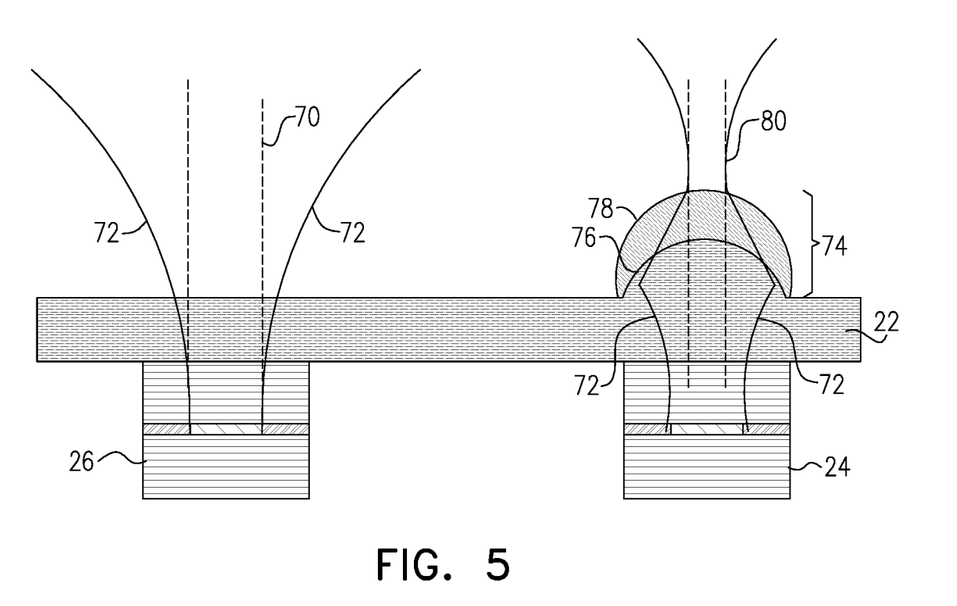
FIG. 5 is a schematic, sectional detail view of two types of emitters in an integrated emitter array, in accordance with an embodiment of the invention.

FIG. 5 is a schematic, sectional detail view of two types of VCSELs 24 and 26 in an integrated array, including a microlens doublet 74 over VCSEL 24, in accordance with an embodiment of the invention. VCSEL 26 has no microlens, as in the preceding embodiments.

VCSELs often emit light in high-order transverse modes, which given rise to a beam 72 that propagates through substrate 22 and exits with high divergence. Beam 72 has a beam waist located at the confinement layer of the VCSEL, below substrate 22, and it is this beam waist that defines an optical aperture 70 of the beam. The minimum size of this beam waist is a function of the required output power and the VCSEL manufacturing process. Large optical apertures 70, however, require more complex projection optics, of longer effective focal length, in order to project spot patterns with fine resolution. A singlet microlens can demagnify the optical aperture by focusing beam 72, but at the cost of increasing the divergence of the VCSEL, and therefore increasing the complexity of the projection optics.

As a solution to this problem, doublet 74 uses a pair of microlenses 76 and 78 to recover (or even improve) the divergence of beam 72 after demagnification. Typically, microlens 76 is etched into the back surface of substrate 22, and thus comprises the same semiconductor material as the substrate, such as GaAs. Microlens 78, comprising a polymer or glass material, for example, is then deposited over microlens 76. Typically (although not necessarily), an array of microlenses 78 is deposited over and in alignment with a corresponding array of microlenses 76 on a III-V semiconductor wafer, thus forming an array of doublets 74, as shown in the figures that follow. Doublets 74 are aligned with respective VCSELs 24 (or other emitters) on the opposite side of the wafer.

Doublet 74 refocuses beam 72 to a waist 80 at or above the upper surface of microlens 78. Waist 80, and hence the effective size of the optical aperture of VCSEL 24, may be smaller than the native aperture 70 of the VCSEL. As a consequence, the projection optics used with VCSEL 24 may have a short effective focal length and larger field of view than can practically be used with VCSEL 26, or even with a VCSEL having only a singlet microlens. Furthermore, because doublet 74 projects waist 80 to a plane above substrate 22, the lower surface of the projection optics can be brought into very close proximity with wafer 22—so that waist 80 is located at the front focal plane of the optics notwithstanding the short effective focal length—without risk that the optics will contact and damage delicate structures on the wafer, such as bond wires. The use of doublets 74 thus enables the VCSEL array device to be integrated into a very compact optical package, with short focal length, close working range, and wide field of view.

Microlens doublets can also be useful in compensation for alignment tolerances between etched microlenses 76 on one side of substrate 22 and VCSELs 24 on the opposite side. Precise front-to-back alignment of this sort can be difficult to achieve, particularly for a GaAs substrate, which is opaque to visible light. Misalignment of the array of microlenses 76 will cause a global pointing error of the VCSEL beams, which must then be taken into account in the system optical design. In a doublet design, on the other hand, the arrays of additional microlenses that is formed over the etched microlenses can be intentionally offset in order to compensate for the misalignment of the GaAs microlens array.

Figure 6:
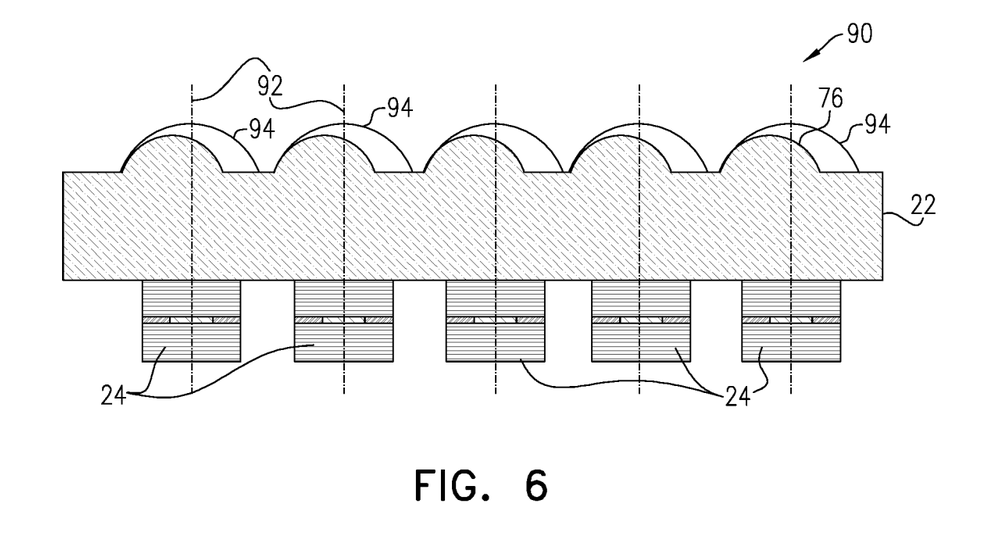
FIG. 6 is a schematic sectional view of an integrated emitter array, in accordance with another embodiment of the invention.

FIG. 6 is a schematic sectional view of an integrated emitter array 90 of this sort, in accordance with another embodiment of the invention. In the pictured example, microlenses 76 were etched on the back side of substrate 22 with their optical centers unintentionally shifted relative to optical axes 92 of the corresponding VCSELs 24, along a direction transverse to the face of the substrate. To compensate for this error, microlenses 94, comprising a polymer material, for example, are offset in the opposite transverse direction, relative to microlenses 76. The offset is chosen so as to correct the pointing error that would otherwise arise due to microlenses 76, so that the VCSEL beams will be directed by the microlens doublets along optical axes that are approximately normal to substrate 22.

Detection and compensation for misalignment of microlenses 76 can be a part of the manufacturing process of array 90. For example, the misalignment between the microlenses 76 and VCSELs 24 can be detected by creating fiducial marks as part of the manufacturing processes of the VCSELs and microlenses on both sides of wafer 22, and then measuring the offset between the fiducial marks using suitable metrology equipment. Alternatively or additionally, the offset can be measured by active optical testing of the VCSELs. Once the offset has been detected and measured, the required offset of microlenses 94 can be calculated, and the mold or mask that is used to produces microlenses 94 can then be shifted accordingly so as to compensate for the detected misalignment. The fiducial marks associated with microlenses 76 can be used to align microlenses 94 precisely in the desired position.

Figure 7A:
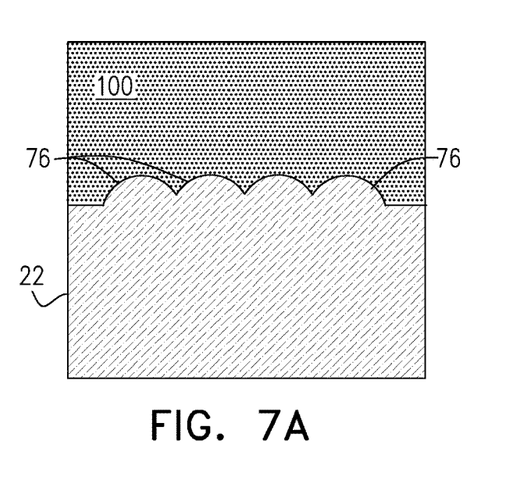
FIGS. 7A, 7B and 7C are schematic sectional views showing successive stages in the production of an array of microlens doublets, in accordance with an embodiment of the invention.
Figure 7B:
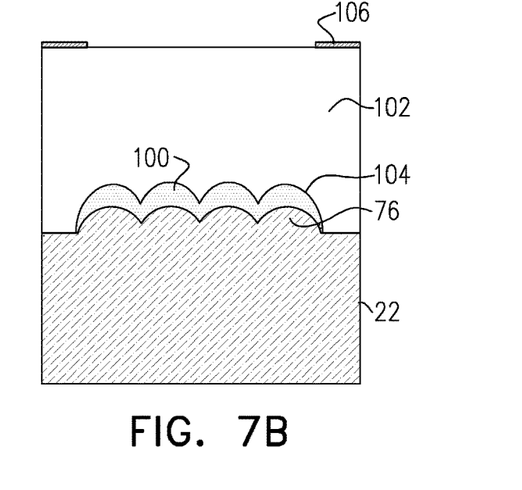
Figure 7C:
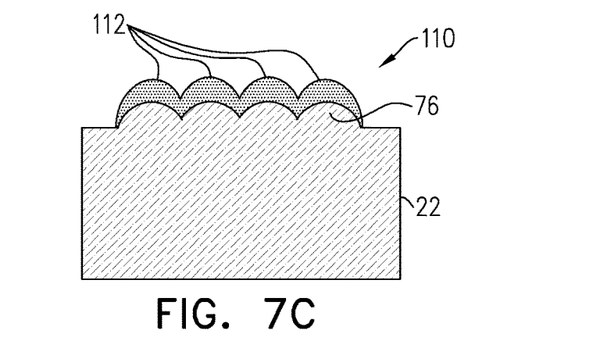

FIGS. 7A, 7B and 7C are schematic sectional views showing successive stages in the production of an array 110 of microlens doublets, in accordance with an embodiment of the invention. At the initial stage shown in FIG. 7A, it is assumed that semiconductor substrate 22 has already been etched to define an array of microlenses 76, and is then coated with a layer of a curable, transparent polymer material 100, for example a photoresist resin, such as SU-8.

In FIG. 7B, a transparent mold 102, including a negative microlens form 104, is pressed against substrate 22, thus shaping polymer material 100 into the form. Mold 102 typically comprises glass or fused silica, and form 104 can be produced using processes that are known in the art for fabricating microlenses on glass and fused silica substrates, for example. The polymer material 100 remaining below mold 102 is then irradiated through the mold with ultraviolet light, in order to cure the polymer in the desired shape. Mold 102 may include a photomask 106 so that the ultraviolet light is incident only in the desired areas of wafer 22. Mold 102 is then removed, leaving array 110 with polymer microlenses 112 deposited over etched microlenses 76, as shown in FIG. 7C.

In an alternative embodiment, the polymer microlenses are produced by applying a photolithographic process to polymer material 100. For this purpose, polymer material 100 may comprise a polymer, such as polymethyl methacrylate (PMMA), that can be etched using ultraviolet (UV) light, for example by a process of UV-induced scission. Material 100 is irradiated by UV light through a gray-scale photomask, which defines the shapes of microlenses 112. Following UV exposure, a chemical developer is applied to remove the excess polymer material, leaving array 110 as shown in FIG. 7C.

Figure 8:
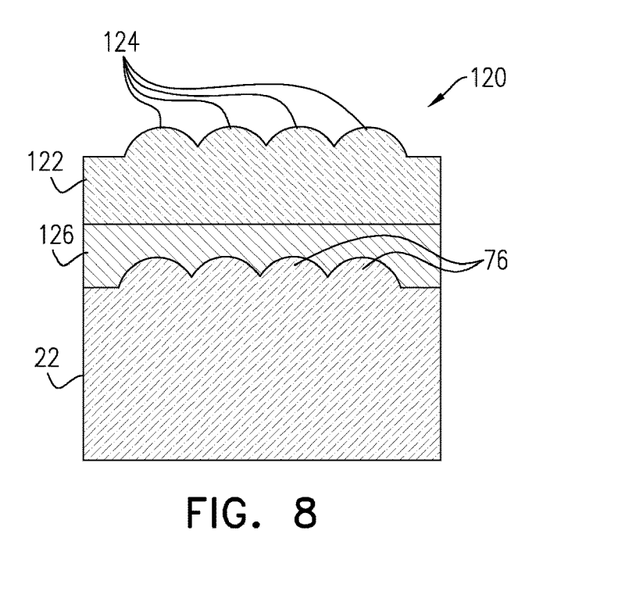
FIG. 8 is a schematic sectional view of an array of microlens doublets, in accordance with another embodiment of the invention.

FIG. 8 is a schematic sectional view of an array 120 of microlens doublets, in accordance with yet another embodiment of the invention. This embodiment uses a glass substrate 122 on which an array of microlenses 124 has been formed, with the same pitch as the array of microlenses 76 on semiconductor substrate 22. Microlenses 124 are produced using processes of glass microlens fabrication that are known in the art. After microlenses 76 have been etched into wafer 22, a layer of transparent optical cement 126, such as NOA 61 (produced by Norland Products, Cranbury, N.J.), is deposited over the wafer. Microlenses 124 are then aligned precisely over corresponding microlenses 76, and UV light is directed through substrate 122 in order to cure cement 126. At this stage, the process is complete.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. An optoelectronic device, comprising:
   a semiconductor substrate having first and second faces;
   an emitter array comprising first and second sets of emitters, which are formed on the first face of the semiconductor substrate and are configured to emit respective first and second beams of radiation through the substrate;
   electrical connections, which are coupled to actuate selectively the first and second sets of the emitters in the emitter array; and
   a microlens array comprising microlenses, which are formed on the second face of the semiconductor substrate in respective alignment with the emitters in at least one of the first and second sets and are configured to focus the beams emitted from the emitters in the at least one of the first and second sets so that the first and second beams are transmitted from the second face with different, respective first and second focal properties.

2. The device according to claim 1, wherein the semiconductor substrate comprises a III-V semiconductor substrate, and wherein the device comprises a silicon substrate on which the electrical connections are formed, the electrical connections comprising bonding pads to which the emitters in the first array are respectively connected.

3. The device according to claim 1, wherein the emitters comprise vertical-cavity surface-emitting lasers (VCSELs).

4. An optoelectronic device, comprising:
a semiconductor substrate having first and second faces;
an emitter array comprising emitters, which are formed on the first face of the semiconductor substrate and are configured to emit respective beams of radiation through the substrate;
electrical connections, which are coupled to actuate selectively first and second sets of the emitters in the emitter array; and
a microlens array comprising microlenses, which are formed on the second face of the semiconductor substrate in respective alignment with the emitters in at least one of the first and second sets and are configured to focus the beams emitted from the emitters in the at least one of the first and second sets so that the beams are transmitted from the second face with different, respective first and second focal properties; and
projection optics, which are configured to focus the beams from the emitters in the first set to form a pattern of structured light in an area of a far field while spreading the beams from the emitters in the second set so as to project flood illumination over the area.

5. The device according to claim 4, wherein the emitters in the first set are disposed across the semiconductor substrate in a predefined spatial distribution, and wherein the pattern of structured light comprises a pattern of spots reproducing the spatial distribution of the emitters in the first set.

6. The device according to claim 4, wherein the microlenses are formed only in alignment with the emitters in the second set.

7. The device according to claim 4, wherein the microlenses that are formed in alignment with the emitters in the second set are displaced transversely on the second face relative to respective ones of the emitters in the second set so as to focus the beams emitted from the emitters in the second set toward a peripheral region of a focal plane of the device, and wherein the projection optics comprises a diffuser disposed in the peripheral region of the focal plane and configured to spread the beams that pass through the peripheral region, while the beams that pass through a central region of the focal plane are not diffused.

8. The device according to claim 7, wherein the projection optics comprise a diffractive optical element (DOE), which is disposed in a central region of the focal plane and is configured to create multiple replicas of the pattern of structured light in the far field.

9. The device according to claim 1, wherein the microlenses in the second array comprise doublet lenses.

10. An optical device, comprising:
a semiconductor substrate having a first face and a second face, which is etched to define a first array of first microlenses configured to focus optical radiation that has been transmitted through the substrate; and
a second array of second microlenses, which is disposed on the substrate over the first array in alignment with the first microlenses so as to form microlens doublets.

11. The device according to claim 10, wherein the semiconductor substrate comprises a III-V semiconductor substrate.

12. The device according to claim 10, and comprising a third array of emitters, which are formed on the first face of the semiconductor substrate in alignment with the first microlenses and are configured to emit respective beams of the optical radiation through the substrate.

13. The device according to claim 12, wherein the emitters comprise vertical-cavity surface-emitting lasers (VCSELs), and wherein the first and second microlenses are configured to focus multiple modes of each of the VCSELs to a respective beam waist outside the semiconductor substrate.

14. The device according to claim 10, wherein the second microlenses comprise a polymer.

15. The device according to claim 10, wherein the second microlenses comprise a glass.

16. The device according to claim 10, wherein the second microlenses are offset in a transverse direction along the second face relative to the first microlenses with which they are respectively aligned.

17. A method for manufacturing an optical device, the method comprising:
etching a semiconductor substrate, having a first face and a second face, to define, on the second face, a first array of first microlenses configured to focus optical radiation that has been transmitted through the substrate; and
depositing a second array of second microlenses over the first array in alignment with the first microlenses so as to form microlens doublets.

18. The method according to claim 17, wherein depositing the second microlenses comprises molding a polymer over the second face to define the second microlenses.

19. The method according to claim 17, wherein depositing the second microlenses comprises applying a photolithographic process to a polymer layer extending over the second face to define the second microlenses.

20. The method according to claim 17, wherein depositing the second microlenses comprises detecting a misalignment between the first microlenses and emitters of the optical radiation disposed on the first face of the semiconductor substrate, and offsetting the second microlenses in a transverse direction along the second face relative to the first microlenses so as to compensate for the detected misalignment.

* * * * *